US009870863B2

(12) United States Patent
Hamm

(10) Patent No.: US 9,870,863 B2
(45) Date of Patent: Jan. 16, 2018

(54) PEAK TEMPERATURE ATTENUATION FILM

(71) Applicant: Goodrich Corporation, Charlotte, NC (US)

(72) Inventor: Richard Roy Hamm, Brooklin, ME (US)

(73) Assignee: Goodrich Corporation, Charlotte, NC (US)

( * ) Notice: Subject to any disclaimer, the term of this patent is extended or adjusted under 35 U.S.C. 154(b) by 160 days.

(21) Appl. No.: 14/661,721

(22) Filed: Mar. 18, 2015

(65) Prior Publication Data

US 2015/0279561 A1  Oct. 1, 2015

Related U.S. Application Data

(60) Provisional application No. 61/971,787, filed on Mar. 28, 2014.

(51) Int. Cl.
*H01G 4/30* (2006.01)
*H01G 2/08* (2006.01)
*H01G 4/008* (2006.01)
*H01G 4/33* (2006.01)
*H01G 2/14* (2006.01)
*C23C 14/16* (2006.01)
*C23C 14/24* (2006.01)
*B64D 15/12* (2006.01)

(52) U.S. Cl.
CPC .............. *H01G 4/008* (2013.01); *B64D 15/12* (2013.01); *C23C 14/16* (2013.01); *C23C 14/24* (2013.01); *H01G 2/14* (2013.01); *H01G 4/33* (2013.01)

(58) Field of Classification Search
CPC .............. H01G 4/30; H01G 2/08; H01G 4/008
See application file for complete search history.

(56) References Cited

U.S. PATENT DOCUMENTS

| 4,783,373 A | 11/1988 | Baumeister et al. |
| 5,143,325 A | 9/1992 | Zieve et al. |
| 6,910,266 B2 | 6/2005 | Lee et al. |
| 7,246,773 B2 | 7/2007 | Stoner et al. |
| 7,703,300 B2 | 4/2010 | Petrenko |
| 7,901,781 B2 | 3/2011 | Maschwitz et al. |
| 8,366,047 B2 | 2/2013 | Euvino, Jr. et al. |

(Continued)

FOREIGN PATENT DOCUMENTS

| EP | 0488048 A1 | 6/1992 |
| EP | 2682375 A1 | 1/2014 |

(Continued)

OTHER PUBLICATIONS

EPCOS AG, Film Capacitors, General Information, May 2009, 42 pages.

(Continued)

*Primary Examiner* — Eric Thomas
(74) *Attorney, Agent, or Firm* — Kinney & Lange, P.A.

(57) ABSTRACT

A heat transfer system comprises a substrate and a thin film coating in physical and thermal contact with the substrate at an interface. The substrate is configured to transmit thermal waves, and has a first effusivity and a first thickness. The thin film coating has a second effusivity less than the first effusivity, and a second thickness less than the first thickness.

11 Claims, 2 Drawing Sheets

(56) References Cited

U.S. PATENT DOCUMENTS

| | | | |
|---|---|---|---|
| 2003/0155467 A1 | 8/2003 | Petrenko | |
| 2006/0011963 A1 | 1/2006 | Poplett et al. | |
| 2006/0079050 A1* | 4/2006 | Cahalen | H01G 4/005 438/250 |
| 2008/0047739 A1* | 2/2008 | Ishii | H05K 1/0218 174/255 |
| 2014/0070054 A1* | 3/2014 | Burton | B64D 15/12 244/134 D |
| 2014/0321027 A1* | 10/2014 | Nguyen | H01G 11/04 361/502 |

FOREIGN PATENT DOCUMENTS

| | | |
|---|---|---|
| EP | 2808258 A1 | 12/2014 |
| JP | 04368114 A * | 12/1992 |

OTHER PUBLICATIONS

Wang, H. Discussion on Arrhenius Law for Capacitor Lifetime Prediction, Aalborg University, Denmark, Center of Reliable Power Electronics, Slide Presentation, www,corpe.et.aau.dk/cap, 7 pages.
Adelson, L. and Farr, H. Polypropylene-Film Capacitors for Military and Industrial A-C Applications Dearborn Electronics, Inc. Longwood, FL, 8 pages.
Ennis, J., et al High-Specific-Power Capacitors Engineering Bulletin, General Atomics Energy Products, San Diego CA 2008, 5 pages.
Kerrigan, R. and Kropiewnicki, B. Film Capacitor Thermal Strategies Increase Power Density NWL Capacitor Operation, Snow Hill NC, 5 pages.
General Atomics Energy Products Engineering Bulletin Capacitors San Diego CA, 29 pages.
Almond, D. and P. Patel. Photothermal Science and Techniques. Chapman & Hall, 1996, pp. 7-33 and Title Pages.
Rief, B. Thermal-wave transient behavior. Canadian Journal of Physics Sep. 1986: pp. 1303-1306.
Bewilogua, K., et al. Surface technology for automotive engineering. CIRP Annals—Manufacturing Technology vol. 58, No. 2, 2009: pp. 608-627.
Krapez, Jean-Claude. Thermal effusivity profile characterization from pulse photothermal data. Journal of Applied Physics May 1, 2000: pp. 4514-4524.
Shendeleva, Margarita. Thermal wave reflection and refraction at a plane interface: Two-dimensional geometry. Physical Review B, Mar. 26, 2002: pp. 1-8.
Balageas, D. and J.Krapez and P. Cielo. "Pulsed photothermal modeling of layered materials," Journal of Applied Physics Jan. 15, 1986: pp. 348-357.
Jaarinen, J. and M. Luukkala. "Numerical analysis of thermal waves in stratified media for non-destructive testing purposes," Journal De Physique Oct. 1983: pp. C6-503-C6-508.
Thomas, R. Reflections of a thermal wave imager: "Two decades of research in photoacoustics and photothermal phenomena," Analytical Sciences Apr. 2001vol. 17 Special issue: s1-s4.
Kim, S. and R. Taylor. "Estimation of thermophysical properties of a film coated on a substrate using pulsed transient analysis," International Journal of Thermophysics, vol. 14, No. 1, 1993: pp. 135-147.
Choi, Sun and Kim Dongsik and Sung-Noon Choa. "Thermal diffusivity of metallic thin films: Au, Sn, Mo, and Al/Ti alloy," International Journal of Thermophysics Sep. 2006: pp. 1551-1563.
Lima, Gustavo and Sandro De Lima E Silva. "Thermal effusivity estimation of polymers in time domain," J. of the Braz. Soc. of Mech. Sci. & Eng. Oct.-Dec. 2011: pp. 393-399.
Silva, Lima."Estimation of thermal effusivity of polymers using the thermal impedance method," Latin American Applied Research vol. 40 No. 1 2010.
Extended European Search Report from EP Application Serial No. 15160875.9, dated Aug. 11, 2015, 7 pages.
Pech-May, Nelson Wilbur, "Simultaneous Measurement of Thermal Diffusivity and Effusivity of Solids Using the Flash Technique in the Front-Face Configuration", Measurement Science and Techology, vol. 26, 2015.

* cited by examiner

PEAK TEMPERATURE ATTENUATION FILM

CROSS-REFERENCE TO RELATED APPLICATION(S)

This application claims priority to U.S. Provisional Application No. 61/971,787, filed on Mar. 28, 2014, and entitled "PEAK TEMPERATURE ATTENUATION FILM", the disclosure of which is incorporated by reference in its entirety.

BACKGROUND

The present invention relates generally to solid state heat management, and more specifically to pulsed electrothermal ice protection systems.

Ice protection systems for aircraft include de-icing and anti-icing systems that remove and prevent ice buildup, respectively. Many ice protection system rely on direct or continuous and/or intermittent resistive heating. Some newer systems use pulsed power heating with rapid discharge capacitors. Compared to traditional ice protection systems, pulsed power systems operate at higher peak temperatures, and are accordingly more power efficient, offering considerable energy savings. Pulsed power ice protection systems accumulate energy via capacitor banks that discharge briefly and rapidly into electrothermal elements (e.g. resistive heaters). Furthermore, heat pulses from pulsed power ice protection systems tend to remove ice in layers of chunks, thereby avoiding or reducing the ice run-back (i.e. melt water refreezing) common in traditional systems. Although traditional electrothermal melting systems are adequate to many applications, pulsed power ice protection systems offer improved power efficiency.

As mentioned above, pulsed power systems commonly use capacitors or capacitor banks to store energy for brief, high-intensity thermal pulses. Transient current flow through capacitor electrodes and collateral contact layers during capacitor discharge causes resistive heating due to bulk resistance. During capacitor discharge, high peak temperatures can cause permanent capacitance losses. Accordingly, capacitor self-heating during transient discharges can be a significant limiting factor in determining part lifetimes of capacitors and ice protection systems using capacitors.

SUMMARY

In one embodiment, the present invention relates to a heat transfer system comprising a substrate and a thin film coating. The substrate and the thin film coating are in physical and thermal contact at an interface. The substrate is configured to transmit thermal waves, and has a first effusivity and a first thickness. The thin film coating has a second effusivity less than the first effusivity, and a second thickness less than the first thickness.

In another embodiment, the present invention relates to a a method of reducing peak temperatures in an electrically conductive substrate due to transient thermal waves. The method comprises applying a thin film coating in contact with the electrode at an interface such that reflections of the transient thermal waves across the interface interfere destructively with the transient thermal waves.

Figure 1:
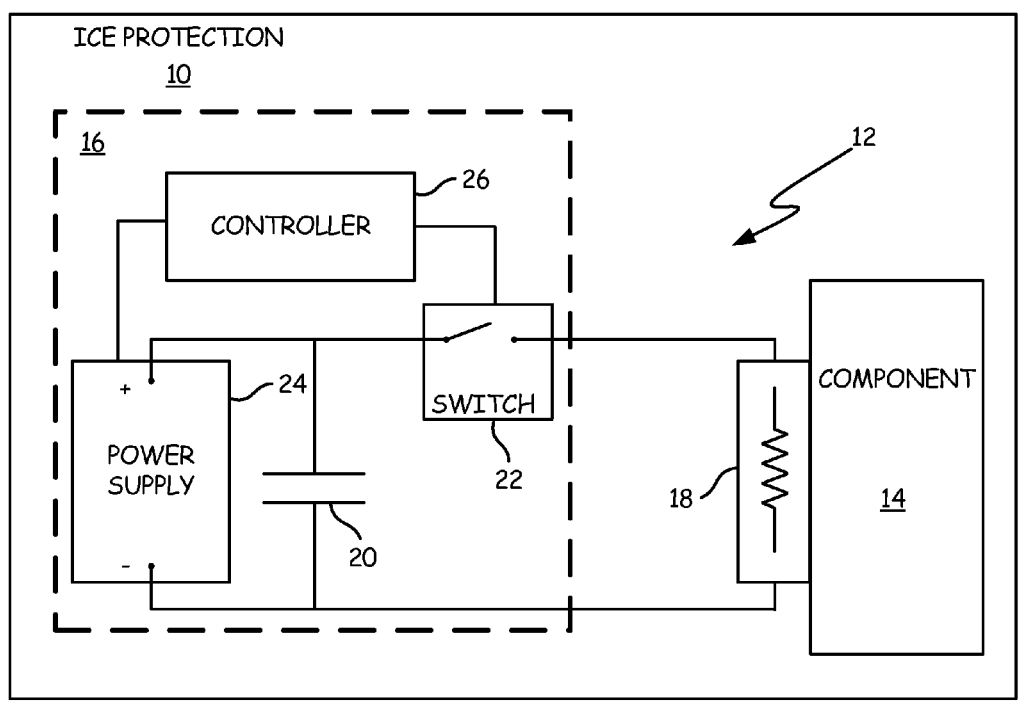
FIG. 1 is a schematic block diagram of an ice protection system.

While the above-identified figures set forth embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

In a variety of applications including ice protection systems, capacitors exposed to high peak temperatures due to internal transient thermal waves can experience degradation due to overheating. To prevent overheating and resulting losses in part lifetime, the present invention coats capacitor electrodes with thin film conductive coatings that reduce peak temperatures, as described in detail below.

FIG. 1 is a schematic block diagram of ice protection system 10, comprising pulsed power heating circuit 12, heated component 14, pulse generator 16, and resistive heater 18. Pulse generator 16 comprises capacitor 20, switch 22, power supply 24, and controller 26. Pulsed power heating circuit 12 heats component 14, thereby melting ice or avoiding ice buildup. Ice protection system 10 can, for example, be an aircraft pulsed power heating-based anti-icing or de-icing system wherein component 14 is an engine or wing component. Pulsed power heating circuit 12 is a circuit disposed to periodically power resistive heater 18 with brief, intense pulses from pulse generator 16, thereby producing high peak temperature heat waves suited to efficiently melt ice as in anti-icing applications and shed ice as a de-icing applications.

Pulse generator 16 is a submodule of pulsed power heating circuit 12 disposed to create narrow width, high intensity electrical pulses that power resistive heater 18. Resistive heater 18 can be any appropriate thermoelectric heater. Some embodiments of pulsed power heating circuit 12 can include multiple pulse generators 14 and/or resistive heaters 16. Capacitor 20 is a rapid discharge capacitor, capacitor bank, or similar structure that discharges within milliseconds through resistive heater 18 when switch 22 is closed, and is charged by power supply 24 while switch 22 is open. Discharge of capacitor 20 causes resistive heater 18 to produce intense, short duration thermal pulses (e.g. ~2 seconds in duration). Controller 26 controls switch 22 and power supply 24, thereby determining how frequently pulse generator 16 fires, and avoiding unnecessary power draw during off periods.

Pulse generator 16 fires when switch 22 closes, causing capacitor 20 to rapidly discharge. During its discharge, capacitor 20 experiences large transient current flow through capacitor electrodes and collateral contact layers that produces substantial resistive heating. To extend the lifetime of capacitor 20 and ice protection system 10, capacitor 20 is equipped with a thin conductive film for peak temperature attenuation, as described below with respect to FIG. 2.

Figure 2:
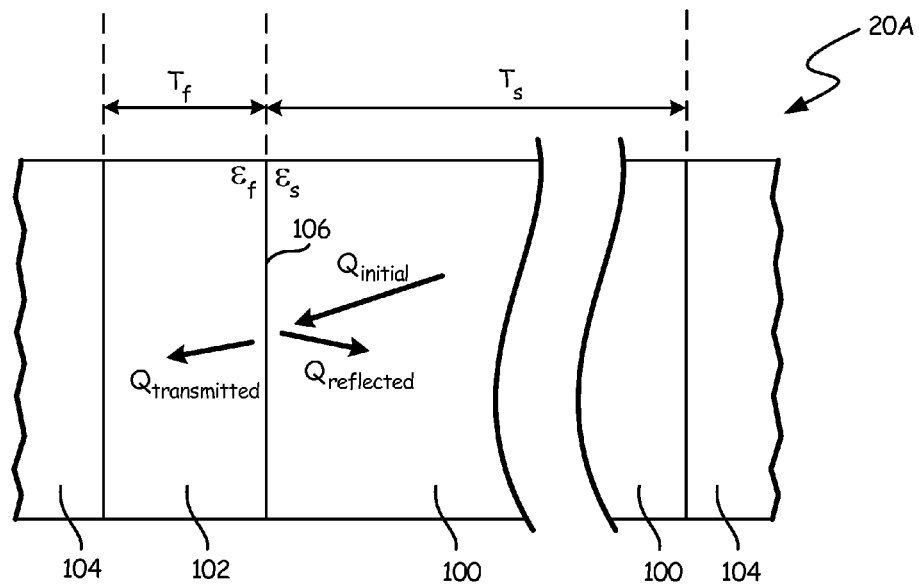
FIG. 2 is a simplified close-up view of one embodiment of a capacitor electrode of the ice protection system of FIG. 1.
Figure 3:
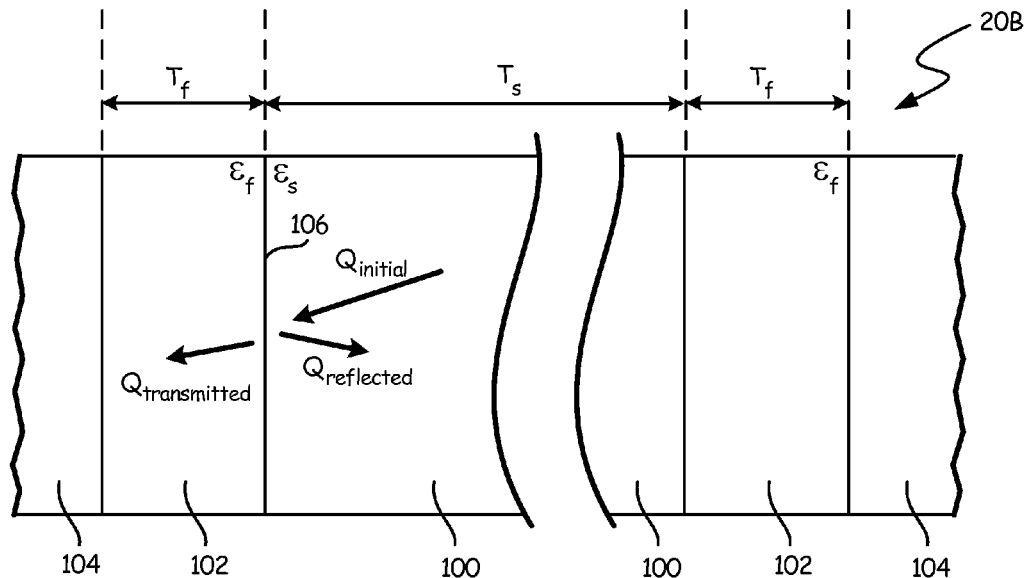
FIG. 3 is a simplified close-up view of another embodiment of a capacitor electrode of the ice protection system of FIG. 1.

FIGS. 2 and 3 are simplified close-up cross-sectional views of embodiments of capacitor 20 of ice protection system 10, illustrating electrode layer 100, thin film coating 102, and dielectric layers 104. Electrode layer 100 meets thin film coating 102 at interface 106. FIG. 2 illustrates capacitor 20a, an embodiment of capacitor 20 wherein a single thin film coating 102 abuts electrode layer 100. FIG. 3 illustrates capacitor 20b, an embodiment of capacitor 20 wherein electrode layer 100 is sandwiched between thin film coatings 102. FIGS. 2 and 3 illustrate only one section of capacitor 20, which can have many repeating layers of dielectric sandwiched between electrodes. In general, capacitor 20 can comprise any number of repeating layers of film coating 102, electrode 100, and dielectric layer 104. FIGS. 2 and 3 are not drawn to scale.

Electrode layer 100 is a substrate formed of an electrical conductor, e.g., of copper, nickel, aluminum, titanium, or alloys thereof. Electrode layer 100 is a capacitor electrode of capacitor 108 that is charged while switch 22 is closed, and discharges when switch 22 closes (see FIG. 1). Electrode layer 100 also produces and transmits initial thermal waves $Q_{initial}$ as a result of ohmic heating from bulk resistance during discharge and charging. Although discussion herein focuses primarily on the reduction of peak temperatures from heating due to rapid discharge of capacitor 20, charging can also contribute to overheating, thus limiting part lifetimes. Electrode layer 100 has substrate thickness $T_s$ and substrate thermal effusivity $\in_s$, with:

$$\in_s = (C_p * \rho_p * \kappa_p)^{1/2} \quad \text{[Equation 1]}$$

where $C_p$, $\rho_p$, and $\kappa_p$ are the specific heat, density, and thermal conductivity of the substrate, respectively).

Thin film coating 102 is an electrically conductive layer in physical and thermal contact with electrode layer 100 at interface 106. Thin film coating 102 flattens or attenuates thermal waves within electrode 100, thereby reducing peak temperatures in capacitor 20 while conserving energy. Thin film coating 102 is intimately bonded to electrode layer 100 at interface 106, e.g. via molecular bonding with no contamination, or negligible contamination. Thin film coating 102 can, for example, be deposited on electrode layer 100 via physical vapor deposition (PVD) or equivalent processes including optical sintering with nano-metal inks on conductive substrates. Thin film coating 102 can be formed, e.g. of copper, silver, and/or nickel. Thin film coating 102 has film thickness $T_f$ and film thermal effusivity $\in_f$.

Film thickness $T_f$ is much less than substrate thickness $T_s$, so as to present as little variance as possible over the bulk ohmic resistance of electrode 100. In some embodiments, substrate thickness $T_s$ can, for example, be more than 400 times greater than film thickness $T_f$. In further embodiments, substrate thickness $T_s$ can, for example, be more than 1000 times greater than film thickness $T_f$. A person skilled in the art will understand that substrate and film thicknesses $T_s$ and $T_f$ can be tailored as appropriate to particular applications, but optimum values of $T_s$ and $T_f$ depend on the thermal wavelength and diffusion length of initial thermal wave $Q_{initial}$. In general, film thickness $T_f$ can be on the order of the thermal wavelength of initial thermal wave $Q_{initial}$.

Film effusivity $\in_f$ is less than substrate effusivity $\in_s$. The difference in thermal effusivities between electrode layer 100 and thin film coating 102 at interface 106 causes a portion of initial thermal wave $Q_{initial}$ from electrode layer 100 to be reflected as reflected thermal wave $Q_{reflected}$, while the remainder is transmitted on to thin film coating 102 as transmitted thermal wave $Q_{transmitted}$. In general, the greater the difference between film effusivity $\in_f$ and substrate effusivity $\in_s$, the greater the degree of thermal wave reflectance. In some embodiments, substrate effusivity $\in_s$ can be at least twice film effusivity $\in_f$. Because $\in_f < \in_s$, reflected thermal wave $Q_{reflected}$ interferes destructively with initial thermal wave $Q_{initial}$, producing a flattened resultant thermal wave $Q_{net} = Q_{initial} + Q_{reflected}$ that describes aggregate heat propagation in electrode layer 100. $Q_{net}$ is flatter than $Q_{net}$, with lower, wider peaks that produce reduced peak temperatures. By reducing the peak temperatures of capacitor 20, thin film coating 102 helps limit capacitance loss due primarily to dielectric degradation capacitor 20, increasing part lifetimes of pulsed power heating circuit 12.

As illustrated in FIGS. 2 and 3, respectively, capacitors 20a and 20b are substantially identical, differing only in that capacitor 20b includes thin film coatings 102 on either side of each electrode layer 100. Capacitors 20a and 20b operate analogously, but the introduction of additional thin film coating layers allows for greater temperature control. In the embodiment of FIG. 2, capacitor 20a comprises repeating layers of electrode layer 100, thin film coating 102, and dielectric layer 104, repeating in an ABCABCABC pattern. In the embodiment of FIG. 3, capacitor 20b comprise repeating layers of thin film coating 102, electrode layer 100, thin film coating 102, and dielectric layer 104, repeating in an ABACABACABAC pattern.

Although the present invention is described with reference to capacitor 20 of ice protection system 10, a person skilled in the art will recognize that thin film coating 102 may advantageously be applied to any electrically conductive substrate at risk of overheating from transient thermal waves, and not merely to capacitor components such as electrode layer 100. By broadening thermal wave peaks within electrode layer 100 or similar at-risk substrates, thin film coating 102 reduces peak amplitude and correspondingly increases part lifetimes by avoiding damage or deterioration from overheating.

DISCUSSION OF POSSIBLE EMBODIMENTS

The following are non-exclusive descriptions of possible embodiments of the present invention.

A peak temperature attenuation system comprising: a substrate configured to transmit thermal waves, the substrate having a first thermal effusivity and a first thickness; and a thin film coating in physical and thermal contact with the substrate at an interface, the thin film coating having a second effusivity less that the first thermal effusivity, and a second thickness less than the first thickness.

The peak temperature attenuation system of the preceding paragraph can optionally include, additionally and/or alternatively, any one or more of the following features, configurations and/or additional components:

A further embodiment of the foregoing peak temperature attenuation system, wherein the substrate is configured to produce the thermal waves.

A further embodiment of the foregoing peak temperature attenuation system, wherein the substrate is an electrode of a capacitor.

A further embodiment of the foregoing peak temperature attenuation system, wherein the capacitor is configured to discharge to power a resistive heater of an ice protection system.

A further embodiment of the foregoing peak temperature attenuation system, wherein the second thickness is on the order of a thermal wavelength of the thermal waves.

A further embodiment of the foregoing peak temperature attenuation system, wherein the first thickness is at least 400 times the second thickness.

A further embodiment of the foregoing peak temperature attenuation system, wherein the substrate and the thin film coating are bonded at the interface via molecular bonding with substantially no contamination.

A further embodiment of the foregoing peak temperature attenuation system, wherein the substrate is formed a material selected from the group comprising copper, nickel, aluminum, titanium, and alloys of copper, nickel, aluminum, titanium, and combinations thereof.

A further embodiment of the foregoing peak temperature attenuation system, wherein the thin film coating is formed of an electrically conductive material.

A further embodiment of the foregoing peak temperature attenuation system, wherein the electrically conductive material selected from the group comprising copper, silver, and nickel.

A further embodiment of the foregoing peak temperature attenuation system, wherein the first thermal effusivity is at least twice the second thermal effusivity.

A method of reducing peak temperatures in an electrically conductive substrate due to transient thermal waves, the method comprising applying a thin film coating in contact with the electrode at an interface such that reflections of the transient thermal waves across the interface interfere destructively with the transient thermal waves.

The method of the preceding paragraph can optionally include, additionally and/or alternatively, any one or more of the following features, configurations and/or additional components:

A further embodiment of the foregoing method, wherein applying the thin film coating comprises depositing the coating via physical vapor deposition.

A further embodiment of the foregoing method, wherein the thin film coating has a thickness on the order of a thermal wavelength of the transient thermal wave.

A further embodiment of the foregoing method, wherein the thin film coating has a thermal effusivity less than a thermal effusivity of the electrically conductive substrate.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A peak temperature attenuation system comprising:
a dielectric layer of a capacitor;
a substrate forming an electrode of the capacitor, and configured to transmit thermal waves, the substrate having a substrate thermal effusivity and a substrate thickness; and
a thin film coating disposed between the substrate and the dielectric layer, in physical and thermal contact with the substrate at an interface, the thin film coating having a film thermal effusivity less that the substrate thermal effusivity, and a substantially uniform film thickness on the order of a thermal wavelength of the thermal waves and less than the substrate thickness;
wherein the capacitor discharges power to a resistive heater of an ice protection system.

2. The peak temperature attenuation system of claim 1, wherein the substrate is configured to produce the thermal waves via self-heating.

3. The peak temperature attenuation system of claim 1, wherein the substrate thickness is at least 400 times the film thickness.

4. The peak temperature attenuation system of claim 1, wherein the substrate and the thin film coating are bonded at the interface via molecular bonding with substantially no contamination.

5. The peak temperature attenuation system of claim 1, wherein the substrate is formed a material selected from the group consisting of copper, nickel, aluminum, titanium, and alloys of copper, nickel, aluminum, titanium, and combinations thereof.

6. The peak temperature attenuation system of claim 1, wherein the thin film coating is formed of an electrically conductive material.

7. The peak temperature attenuation system of claim 6, wherein the electrically conductive material is selected from the group consisting of copper, silver, and nickel.

8. The peak temperature attenuation system of claim 1, wherein the substrate thermal effusivity is at least twice the film thermal effusivity.

9. A method of reducing peak temperatures in an electrode substrate of a capacitor due to transient thermal waves using a peak temperature attenuation system, comprising:
a dielectric layer of a capacitor;
a substrate forming an electrode of the capacitor, and configured to transmit thermal waves, the substrate having a substrate thermal effusivity and a substrate thickness; and
a thin film coating disposed between the substrate and the dielectric layer, in physical and thermal contact with the substrate at an interface, the thin film coating having a film thermal effusivity less that the substrate thermal effusivity, and a substantially uniform film thickness on the order of a thermal wavelength of the thermal waves and less than the substrate thickness;
wherein the capacitor discharges power to a resistive heater of an ice protection system,
the method comprising:
applying the thin film coating in physical and thermal contact with the electrically conductive substrate, between the substrate and the dielectric layer of the capacitor, at the interface such that reflections of the transient thermal waves across the interface interfere destructively with the transient thermal waves.

10. The method of claim 9, wherein applying the thin film coating comprises depositing the coating via physical vapor deposition.

11. The method of claim 9, wherein the electrically conductive substrate thermal effusivity is at least twice the film thermal effusivity.

* * * * *